United States Statutory Invention Registration [19]

[11] Reg. Number: H569

Varker et al. [43] Published: Jan. 3, 1989

[54] CHARGE STORAGE DEPLETION REGION DISCHARGE PROTECTION

[75] Inventors: Charles J. Varker, Scottsdale; Syd R. Wilson, Phoenix, both of Ariz.

[73] Assignee: Motorola Inc., Schaumburg, Ill.

[21] Appl. No.: 938,355

[22] Filed: Dec. 4, 1986

Related U.S. Application Data

[63] Continuation of Ser. No. 656,112, Sep. 28, 1984, abandoned.

[51] Int. Cl.[4] ..... H01L 29/167

[52] U.S. Cl. ..... 357/64; 357/41; 357/58; 357/63; 357/91; 437/25

[58] Field of Search ..... 29/576 B; 357/50, 63, 357/58, 84, 64, 23.6, 91, 41, 48; 148/DIG. 83

[56] References Cited

U.S. PATENT DOCUMENTS

| | | | |
|---|---|---|---|
| 3,586,542 | 6/1971 | MacRae | 357/50 X |
| 3,622,382 | 11/1971 | Brack et al. | 357/50 X |
| 4,115,798 | 9/1978 | Platzoeber | 357/64 |
| 4,247,862 | 1/1981 | Klein | 357/48 |
| 4,259,683 | 3/1981 | Abler et al. | 357/58 X |
| 4,291,329 | 9/1981 | Hanes et al. | 357/64 |
| 4,300,107 | 11/1981 | Copeland, III | 357/91 X |
| 4,420,872 | 12/1983 | Solo De Zaldivar | 357/91 X |
| 4,469,528 | 9/1984 | Berth et al. | 357/91 X |
| 4,490,182 | 12/1984 | Scovell | 148/1.5 |
| 4,494,996 | 1/1985 | Ohno et al. | 357/91 X |
| 4,505,759 | 3/1985 | O'Mara | 357/91 X |
| 4,548,654 | 10/1985 | Tobin | 357/91 X |

FOREIGN PATENT DOCUMENTS

| | | | |
|---|---|---|---|
| 0083210 | 6/1983 | European Pat. Off. | 357/23.6 |
| 7603862 | 9/1976 | France . | |
| 0162258 | 12/1980 | Japan | 357/23.6 |
| 57-45947 | 3/1982 | Japan | 357/23.6 |
| 0583270 | 1/1983 | Japan | 357/23.6 |

OTHER PUBLICATIONS

Brack et al., "Prevention of α-Particle Induced Fails in Dynamic Memories," *IBM Technical Disclosure Bulletin,* vol. 22, No. 9, Feb. 1980, p. 4106.

Anantha et al., "Process to Fabricate A Bipolar With Reduced Alpha Particle Damage," *IBM Technical Disclosure Bulletin,* vol. 22, No. 12, May 1980, pp. 5365–5366.

Chakravarti et al., "Processing of Low Leakage/-Ser-Tolerant Si Wafers," *IBM Technical Disclosure Bulletin,* vol. 25, No. 4, Sep. 1982, pp. 1910–1911.

*Primary Examiner*—Stephen C. Buczinski

*Assistant Examiner*—Linda J. Wallace

*Attorney, Agent, or Firm*—Robert M. Handy

[57] ABSTRACT

A means and method is described for shielding semiconductor charge storage devices from the effects of particles or ionizing radiation absorbed within the bulk of the semiconductor substrate, by providing a free carrier shield consisting of a buried layer of very low lifetime in the undisturbed material below the depletion regions associated with the charge storage devices. The very low lifetime layer is obtained by ion implantation of a super-saturated zone of impurities such as oxygen which provide deep recombination centers and which react chemically with the substrate material so as to provide thermally stable complexes which do not anneal away during post implant heating cycles. Concentrations of lifetime killing impurities significantly exceeding the solid solubility limit are achieved so that the lifetime reduction in the carrier shield region greatly exceeds that obtainable by prior art methods. Partial shielding is also provided against carriers injected by nearby junctions or introduced by charge pumping during circuit operation.

5 Claims, 8 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CHARGE STORAGE DEPLETION REGION DISCHARGE PROTECTION

This application is a continuation of application Ser. No. 656,112, filed Sept. 28, 1984, now abandoned.

BACKGROUND OF THE INVENTION

1. Field of the Invention

This invention relates in general to structures and fabrication methods for providing an internal shield to protect depletion regions of semiconductor devices from discharge by ionizing radiation or particles, or other spurious carriers and, more particularly, to improved means and methods for shielding the depletion region of dynamic charge storage devices to prevent undesirable discharge thereon by ionizing radiation or particles absorbed within the device substrate or by carriers injected or pumped from nearby regions.

2. Background Art

Charge storage is a frequently used technique in semiconductor devices and integrated circuits. Examples of devices whose operation depends critically on charge storage are dynamic random access memories, bucket brigade shift registers, and charge coupled imaging devices. Many other kinds of semiconductor devices and integrated circuits also use charge storage. Depletion region charge storage may be accomplished using a physical P-N junction formed by abutting doped P and N regions. However, depletion regions may also be induced, as for example, by means of an MOS capacitor or the like. If a sufficiently large voltage is applied across an MOS capacitor or equivalent, a depletion region akin to that found in a P-N junction is created between the semiconductor surface and the bulk. Such induced depletion regions can equally well be used for charge storage devices. As employed herein, reference to storage of charge on junctions is intended to include charge stored in depletion regions whether formed by a permanently doped P-N junction or field induced or by formed by any other means.

A significant problem that arises in connection with the use of charge storage is that the stored charge is subject to being discharged by minority carriers or electron-hole carrier pairs which reach the depletion region. These free carriers may arise from a number of sources, such as, generation within the junction region, injection from another nearby junction, or diffusion from outside the junction region, i.e., from within the bulk of the underlying semiconductor substrate. The result of the discharge is that the information represented by the stored charge decays. If discharge is severe, the information stored in the form of charge may be lost entirely. As a consequence, the charge representing the stored information must usually be periodically refreshed. The greater the number of free carriers created within or reaching the charge storage depletion region per unit time, the more frequently this stored information must be refreshed, that is, the lost charge replaced.

Thermal carrier generation within the depletion region can dissipate the stored charge. Thermal carrier generation and carrier lifetime are related. In order to minimize thermal carrier generation in the depletion region, the carrier lifetime must be made as long as possible. Thus, great effort is expended to obtain long lifetime material in which to form the depletion regions used for charge storage. However, the longer the lifetime, the greater the probability that carriers from elsewhere in the device, e.g., carriers generated in the underlying substrate or injected from nearby junctions, will diffuse into the depletion region and discharge the stored information. Thus, conflicting requirements are encountered when trying to reduce all sources of carriers which might contribute to dissipating the stored charge and thereby requiring more frequent refresh.

Ionizing radiation and particles absorbed within a semiconductor material produce free carriers by ionization. Generally, the depletion region of a charge storage device is relatively thin so that few ionizing events occur directly therein. Further, the depletion region is often located near a device surface, so that only comparatively low energy radiation or particles are likely to be absorbed there. These low energy particles can be easily filtered out by surface protection layers and so are readily avoided. However, the more energetic particles or radiation will pass through the surface layers and be absorbed in the bulk of the substrate. The carrier pairs freed by ionizing events occurring in the substrate can readily diffuse to the depletion region if the semiconductor substrate has a high lifetime. It has been found that these bulk generated carriers are a significant cause of low storage times in many types of charge storage devices.

One method for reducing the discharging effect of in-diffusing carriers is to reduce the bulk lifetime so that more of the bulk generated carriers recombine before reaching the depletion region of the storage device. Two methods of carrier lifetime control which are commonly used in silicon devices, for example, are electron bombardment and gold doping. Electron bombardment is believed to reduce lifetime by introducing defects in the crystal lattice. A disadvantage of using bombardment induced lattice defects for lifetime control is that such defects anneal out during subsequent high temperature processing steps. Gold doping is another means of controlling lifetime. However, gold doping is incapable of the necessary spatial resolution. For example, gold diffuses so rapidly in silicon at ordinary process temperatures that it travels throughout the entire wafer thickness in a very brief time. Further, the amount of lifetime reduction that can be obtained by these methods is often insufficient to prompt recombination of all in-diffusing carriers.

Another method which has been suggested for providing lifetime control structures is to start with a low lifetime substrate and attempt to grow thereon a high lifetime surface layer in which the charge storage devices would be fabricated. However, this has not proved practical because of the tendency of the substrate to contaminate or create defects in the epilayer, thereby reducing its lifetime.

More recently, argon has been investigated as a means of obtaining localized reduction in lifetime. However, the lifetime reductions from ion implanted argon appear to be primarily related to physical damage to the crystal lattice. As with electron bombardment, the effect is significantly annealed by post implant heating. This is a substantial disadvantage since practical device fabricated methods generally require that the treated wafer be heated to high temperatures during subsequent fabrication steps.

Thus, a need still exists for means and methods for shielding charge storage devices from injected or bulk generated free carriers. Accordingly, it is an object of the present invention to provide improved means and methods for shielding charge storage junctions from bulk generated or otherwise injected carriers.

It is a further object of the present invention to provide improved means and methods for providing high lifetime regions for construction of charge storage devices, while simultaneously providing adjacent low lifetime regions which act as a shield against indiffusion of bulk generated or otherwise injected carriers.

It is an additional object of the present invention to provide improved means and methods for controlling the location, lateral extent, and thickness of such a carrier shield.

It is a further object of the present invention to provide improved means and methods for achieving a very high density of lifetime killing centers in such a carrier shield.

It is an additional object of the present invention to provide means and methods for increasing the density of lifetime killing centers within such a carrier shield to values not previously obtained in the prior art.

It is an additional object of the present invention to provide improved means and methods for obtaining a free carrier shield using impurities which react chemically with the semiconductor substrate to form stable recombination centers.

It is a further object of the present invention to provide an improved means and method for obtaining a free carrier shield whose effectiveness is not substantially annealed by heating.

SUMMARY OF THE INVENTION

The attainment of the foregoing and other objects and advantages is achieved by the present invention wherein there is provided a means for forming radiation shielded charge storage devices comprising, a semiconductor substrate having first and second major surfaces, a high lifetime region adjacent the first major surface and adapted for containing one or more charge storage devices, a low lifetime region in the semiconductor substrate underlying the high lifetime region, wherein the low lifetime region contains reactive ions which form carrier recombination centers. It is essential that the lifetime killing impurities be implanted to dose levels which exceed the solid solubility limit of the impurities in the substrate material. It is desirable that the low lifetime region comprise a planar region of predetermined thickness which is small compared to the separation of the first and second major surfaces, and which is located substantially parallel to the first major surface. For silicon, the low lifetime region is preferably formed by implantation of lifetime killing impurity ions not from the third or fifth columns of the periodic table. Oxygen ions implanted to a concentration exceeding about 30 parts per million atomic and a dose exceeding $1\times10^{15}$ per square centimeter are useful for forming the low lifetime region.

There is further provided a process for forming radiation shielded charge storage devices comprising, providing a semiconductor substrate having a major surface and a first region adjacent to that surface which is adapted for containing charge storage device regions, implanting a second region beneath the first region with lifetime killing reactive impurity ions to a dose exceeding the solid solubility limit of the reactive impurity ions in the substrate at the melting temperature of the substrate, and heating the implanted substrate to a first predetermined temperature to chemically react the impurity ions with the substrate material to form a stable zone of reduced carrier lifetime in the second region. Charge storage devices may be formed in the first region before the implanting step, after the heating step, or between the implanting and heating steps. It is desirable that the implanting step include implanting the lifetime killing reactive impurity ions to a dose exceeding the solid solubility of the lifetime killing impurity ions at the melting temperature of the substrate by at least one order of magnitude.

In another embodiment, the surface of the substrate may conveniently be covered by an epitaxial layer suitable for construction of charge storage devices before or after implantation of the lifetime killing reactive impurity ions. Oxygen is a suitable material for use as a reactive lifetime killing impurity ion. Carbon may be provided in the substrate to act as a nucleation center for controlling the reaction of the implanted oxygen ions. When oxygen is used in silicon, it is desirable that the oxygen ions be implanted to a dose exceeding $1\times10^{15}$ per square centimeter and/or to a peak concentration exceeding about $10^{19}$ per $cm^3$.

DETAILED DESCRIPTION OF THE DRAWINGS

Figure 1:
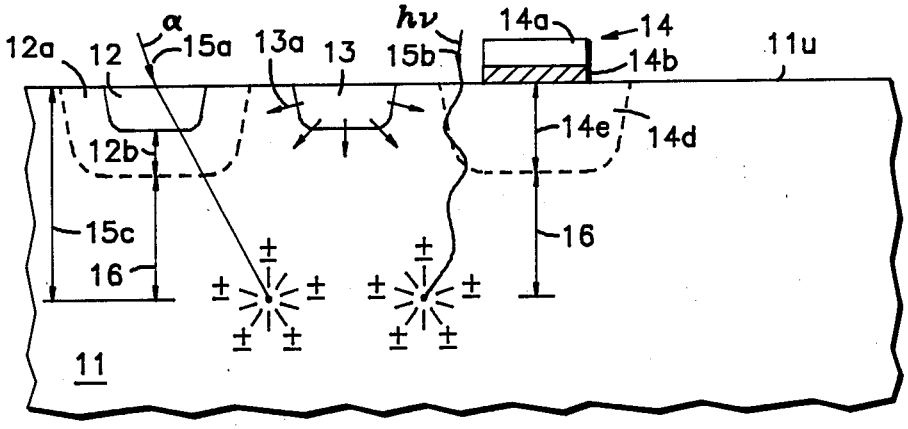
FIG. 1 shows a simplified schematic cross-sectional view of a portion of a semiconductor substrate containing charge storage device regions, according to the prior art.

FIG. 1 shows portion 10 of semiconductor substrate 11 which has therein charge storage device regions 12 and 14. Charge storage device region 12 is doped to a conductivity type opposite that of substrate 11 so that a P-N junction exists between device region 12 and substrate 11. Surrounding region 12, is depletion region **12*a* of width 12*b*. MOS structure 14 consists of metallic electrode 14*a* covering dielectric 14*b* which rests on substrate 11. When appropriately biased, MOS structure 14 depletes the portion of surface 11***u* of substrate 11 underneath electrode 14*a* to form depletion region 14*d* having width 14*e*. Depletion region 14*d* results from charge applied to electrode 14*a* or charge trapped within dielectric region 14*b*. Depletion region 14*d* is induced by this applied or trapped charge. When the applied or trapped charge is removed, depletion region 14*d* disappears. Doped region 13 having a conductivity type opposite substrate 11 is also provided to illustrate the interaction of nearby junctions with charge storage devices 12 and 14.

When substrate 11 is exposed to energetic particles or radiation, as for example, alpha particles indicated by ray 15*a* or ionizing radiation indicated by ray 15*b*, a certain proportion of the particles or radiation will be absorbed within substrate 11 at variable distance 15*c* below surface 11*u*. The magnitude of distance 15*c* depends, among other things, on the energy of the impinging particles or radiation. When radiation 15*b* is absorbed at depth 15*c*, an ionizing event occurs in which electron-hole free carrier pairs are created, as indicated in FIG. 1. Similarly, particles 15*a* can create a series of ionizing events along their path, one of which is depicted as occurring at depth 15*c*. If the lifetime of the free carrier pairs created by the ionization events is large enough, they can diffuse across distance 16 and reach depletion regions 12*a* or 14*d*, where they will contribute to discharging any charge which has been stored on device regions 12 or 14.

It is well-known in the art that free carriers generated within substrate 11 by absorption of energetic particles or ionizing radiation, are a significant cause of stored information loss in semiconductor charge storage devices. The greater the carrier lifetime in substrate 11, the larger is carrier diffusion length 16, and the greater the probability that an ionization event creating free carriers will occur within a diffusion length of the depletion layers. It is not possible to use a low lifetime material for substrates 11 in which to build charge storage devices 12 or 14, since the physical mechanisms which reduce lifetime in the bulk of substrate 11 also increase the generation-recombination leakage current across depletion regions 12*a* or 14*d*, thereby degrading the ability of these depletion regions to store charge even in the absence of free carriers arriving from substrate 11. For good device performance, it is essential that the depletion regions be located in high lifetime material.

Well known lifetime killers such as gold and the like cannot be used as localized lifetime killers. Gold diffuses so readily in silicon that it quickly invades the whole wafer thickness, thereby reducing the lifetime everywhere so that there is no longer any high lifetime surface layer in which to build the charge storage devices. Furthermore, gold tends to segregate preferentially in active device regions, which is particularly undesirable for charge storage devices.

Argon diffuses less rapidly than gold in silicon, but is also not a practical lifetime killer for forming an effective free carrier recombination region since the decrease in lifetime obtained with argon, while initially a factor of about $10^{-4}$, is reduced after heating of the implanted wafers to about $10^{-2}$. This is insufficient to provide adequate shielding. Further, neither gold or argon react chemically with most semiconductor materials so the lifetime killing complexes formed by these materials are inherently unstable.

A further mechanism which adversely affects the behavior of charge storage devices may arise from nearby doped region 13. When nearby 13 is forward biased, minority carriers will be injected into substrate 11, as indicated by arrows 13*a*. Since, the material surrounding the charge storage devices must be high lifetime material, an appreciable fraction of injected carriers 13*a* may reach depletion regions 12*a* and 14*d* of charge storage devices 12 and 14 and cause discharge, just as do the carriers produced in the bulk by ionizing particles or radiation 15*a–b*. Similar effects may be produced by conductors running across the surface of substrate 11 and by other device regions through a phenomenon called charge-pumping. When the voltage on these conductors or devices is varied, as for example during memory write or read operations, minority carriers may be injected into the near surface regions containing the charge storage devices. Such injection and charge pumping effects are undesirable and to be avoided since they degrade the performance of the charge storage devices. Dynamic random access memories are particularly susceptible to such phenomena which frequently manifest themselves as row or column disturb effects. Hence, shielding charge storage devices from such phenomena and effects is particularly important.

Figure 2:
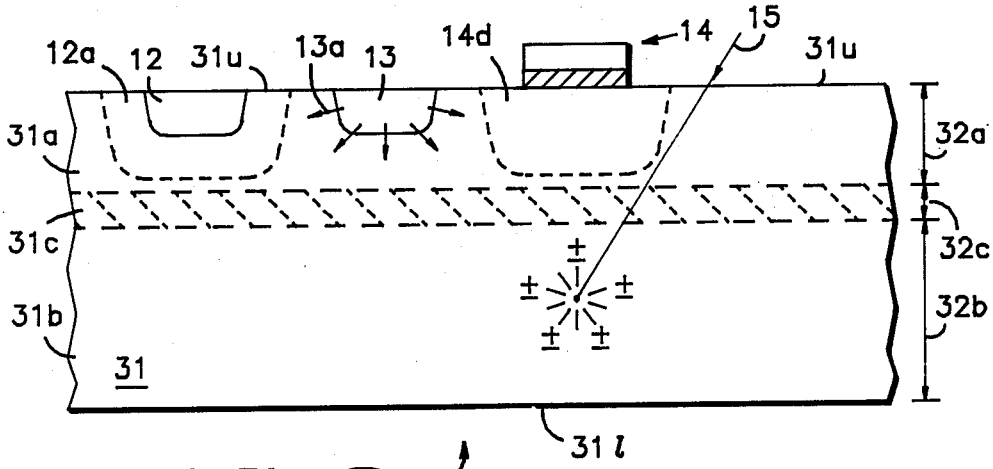
FIG. 2 shows a simplified schematic cross-sectional view of a portion of a semiconductor substrate containing charge storage device regions, according to the present invention.

These and other deficiencies of the prior art may be overcome with the structure of FIG. 2, formed according to the present invention. FIG. 2 shows portion 30 of semiconductor substrate 31 in which have been constructed charge storage device regions 12 and 14. Ray 15 indicates either ionizing particles 15*a* or radiation 15*b*. Junction 13 has the same function as described in connection with FIG. 1. Charge storage devices 12 and 14, and doped region 13 are constructed in zone 31*a* of substrate 31 adjacent surface 31*u*. Substrate 31 is chosen to be a high lifetime material so that zone 31*a* also has this property. This insures that the recombination-generation currents present in devices 12 and 14 will be extremely low and that devices 12 and 14 will inherently have good charge storage properties. In order to prevent electron-hole pairs generated in portion 31*b* of substrate 31 by ionizing particles or radiation 15 from reaching devices 12 and 14 in zone 31*a*, very low lifetime zone or region 31*c* is placed immediately beneath device zone 31*a*. It is desirable that thickness 32*a* of device zone 31*a* be as small as possible consistent with the requirement that depletion regions 12*a* and 14*d* associated with devices 12 and 14 do not expand to contact low lifetime region 31*c*. By placing very low lifetime zone 31*c* close to doped region 13, very low lifetime zone 31*c* also serves as a sink to absorb a large fraction of carriers 13*a* injected from doped region 13 into substrate 31. This reduces the sensitivity of charge storage devices 12 and 14 to minority carriers injected from nearby junction 13 or from adjacent charge pump regions which behave in a similar way with respect to injecting minority carriers into the surface regions of the device structure.

In order for zone or region 31*c* to be effective in shielding charge storage devices 12 and 14 from the effects of carriers generated by ray 15 or injected from region 13 or injected by charge pumping, it is essential that the lifetime in region 31*c* be extremely short. The density of recombination centers in region 31*c* must be so high that virtually all free carriers entering region or zone 31*c* recombine before reaching the charge storage devices.

It has been discovered that a very high density of permanent lifetime killing impurities can be created in a narrow zone within substrate 31, such as in width 32*c* of region or zone 31*c*, by implanting reactive lifetime killing impurities to a concentration which significantly exceeds the normal solid solubility limit of the impurity in the substrate material. For example, oxygen atoms can be implanted into a silicon wafer in a band 1–2 microns thick located a micron or more below the surface and with a super-saturated peak concentration substantially exceeding the solid solubility limit of oxygen in silicon at the melting temperature of silicon. Further, it has been found that such a super-saturated oxygen zone can be produced at a controlled depth within the substrate without destroying the single crystal nature of the substrate surface, or causing such a high density of surface defects as to preclude the construction of high quality charge storage devices in the overlying material. In addition it has been found that the super-saturated oxygen zone is stable during subsequent heat treatments so that post-implant high temperature processing steps do not cause significant annealing, that is, the very low free carrier lifetime in the super-saturated oxygen zone does not decrease or go away on post-implant heating. The stability of the super-saturated oxygen zone is believed to be due to the ability of the oxygen to react chemically with the semiconductor material to form a stable $SiO_x$ phase. This stable $SiO_x$ phase is highly localized and extremely finely divided and, because of the super-saturated oxygen concentration, cannot redissolve in the semiconductor crystal during subsequent heating steps.

As a consequence of the high concentration of recombination centers which can be formed by reacting the super-saturated concentration of implanted ions with the material of substrate 31, the free carrier lifetime in zone 31*c* can be reduced significantly below that which would otherwise be obtained by other means, as for example, by the reaction or activation of impurities already in solution within the crystal, or by use of impurities introduced by diffusion. The concentration of impurities ordinarily in solution is limited by the solid solubility of that impurity in the substrate at the melting point of the substrate. Any further amounts dissolved in the melt segregate out on solidification. Hence, precipitation of dissolved or diffusing impurities is inherently limited to a concentration determined by the solid solubility.

The use of ion implantation permits zone 31*c* to be buried within substrate 31 beneath high lifetime zone 31*a* in which charge storage devices can be constructed. Very low values of effective lifetime (e.g. 15 to 200 picoseconds) can be obtained in zone 31*c*, by implantation of a super-saturated zone of reactive ions. When reacted with the substrate material, these highly concentrated complexes formed from the semiconductor and the implanted ions, act to shield charge storage devices 12 and 14 from the electron-hole carrier pairs generated by ray 15 absorbed within bulk portion 31*b* of substrate 31, or from minority carriers injected from region 13 or introduced by charge pumping.

Figure 3:
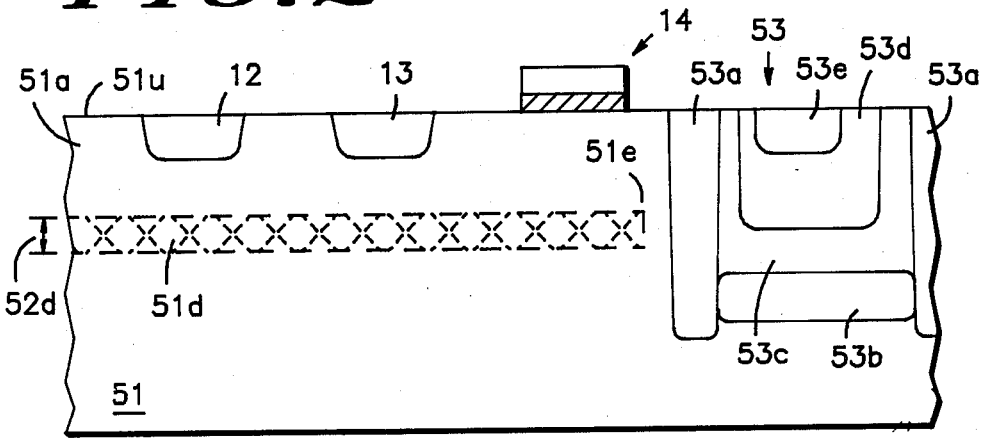
FIG. 3 shows a simplified schematic cross-sectional view of a portion of a semiconductor substrate containing charge storage device regions and a bipolar device region, according to a further embodiment of the present invention.

An additional feature of the present invention as compared with the prior art is illustrated in FIG. 3, which shows a simplified cross-sectional diagram in schematic form of portion 50 of substrate 51 having zone 51*a* adjacent upper surface 51*u* containing charge storage devices 12 and 14, and conventional bipolar device 53. Conventional bipolar device 53 comprises isolation walls 53*a*, buried layer region 53*b*, collector region 53*c*, base region 53*d*, and emitter region 53*e*. Ion implanted low lifetime carrier shield zone 51*d* of thickness 52*d*, according to the present invention, extends laterally only to point 51*e*, and does not extend into the region occupied by bipolar device 53. This lateral localization of carrier shield 51*d* is readily accomplished by masking off the portion of substrate 51 intended to contain bipolar device 53 during implantation of carrier shield 51*d*.

Figure 4:
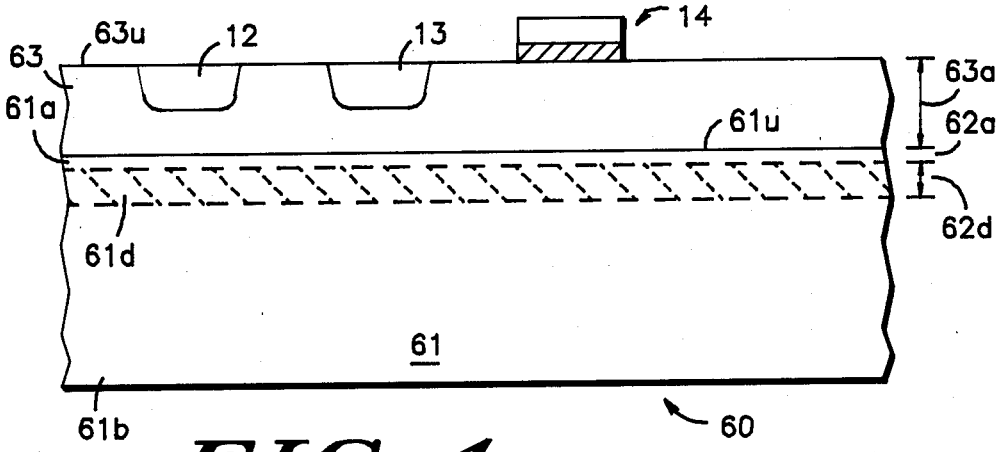
FIG. 4 shows a simplified schematic cross-sectional view of a portion of a semiconductor substrate containing charge storage device regions according to a further embodiment of the present invention.

A further embodiment of the present invention is illustrated in FIG. 4 which shows, in simplified schematic cross-sectional form, portion 60 of semiconductor substrate 61 having upper surface 61*u*. Low lifetime shield region 61*d* produced by ion implantation is located in substrate 61, and serves to protect charge storage devices 12 and 14 from free carriers generated by ionizing events occurring within bulk portion 61*b* of thickness 62*d* of substrate 61. However, rather than placing charge storage devices 12 and 14 directly in surface 61*u* of substrate 61, epitaxial layer 63 is grown on surface 61*u* of substrate 61, and devices 12 and 14 constructed in surface 63*u* of layer 63. It is desirable that layer 63 have thickness 63*a* sufficient to contain the depletion regions of devices 12 and 14, since layer 63 can potentially be formed with great perfection. This improves the characteristics of devices 12 and 14. In order that layer 63 have great perfection, it is desirable that epitaxial layer 63 be separated from carrier shield zone 61*d* by region 61*a* of thickness 62*a*. When shield zone 61*d* is formed prior to epi-layer 63, thickness 62*a* must be of sufficient size so as to preclude the generation of implantation defects in surface 61*u* which might propagate into epi-layer 63. A distance of 0.5 to 1 micron has been found to be adequate for thickness 62*a*.

EXAMPLES

Figure 5A:
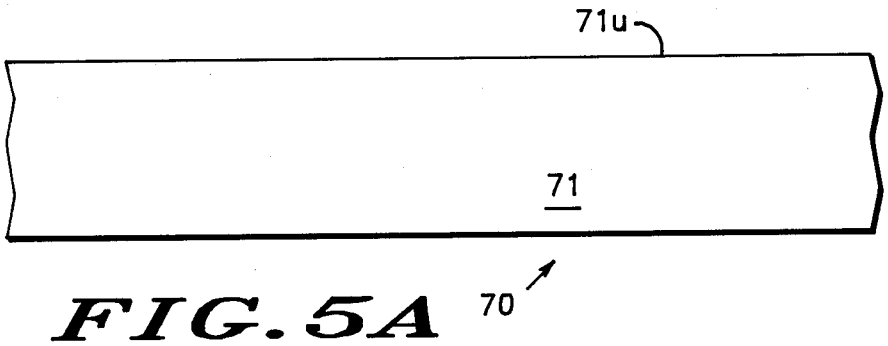
FIGS. 5A–I show simplified schematic cross-sectional views of a portion of a semiconductor substrate having charge storage device regions, during various stages of manufacture and using alternative manufacturing sequences, according to the present invention.
Figure 5B:
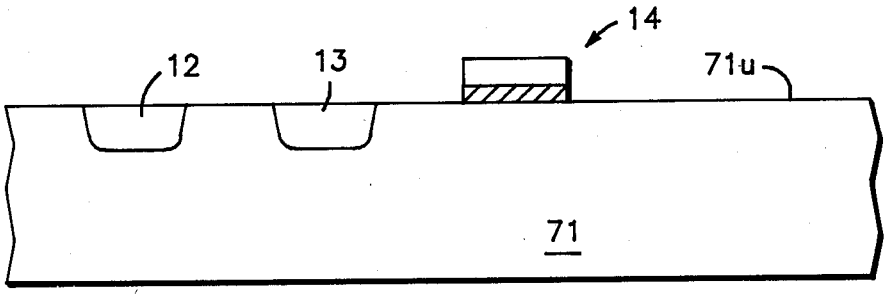
Figure 5C:
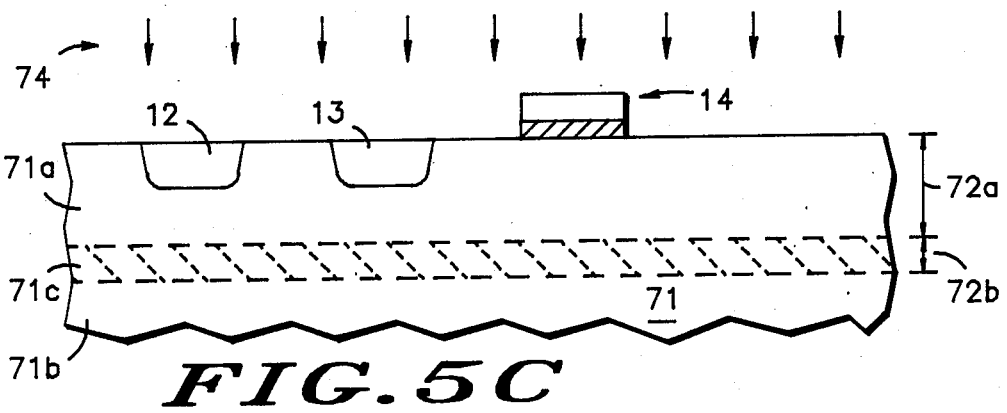

The device structures of FIGS. 2–4 may be constructed according to the methods described herein as follows. FIGS. 5A–I show simplified schematic cross-sectional views of portion 70 of semiconductor substrate 71 containing devices 12–14 fabricated according to the methods of the present invention, at various stages of completion, and according to various alternative methods of fabrication. In a first embodiment of the present invention, charge storage device regions 12 and 14 are formed in region 71*a* adjacent surface 71*u* of substrate 71 (FIGS. 5A–B) by means well-known in the art. Subsequent to the formation of charge storage device regions 12 and 14, ions 74 are implanted through device regions 12 and 14 to produce buried layer regions 71*c* of width 72*b* at depth 72*a* below surface 71*u* and above region 71*b* of substrate 71, to act as a free carrier shield (FIG. 5C).

Figure 6:
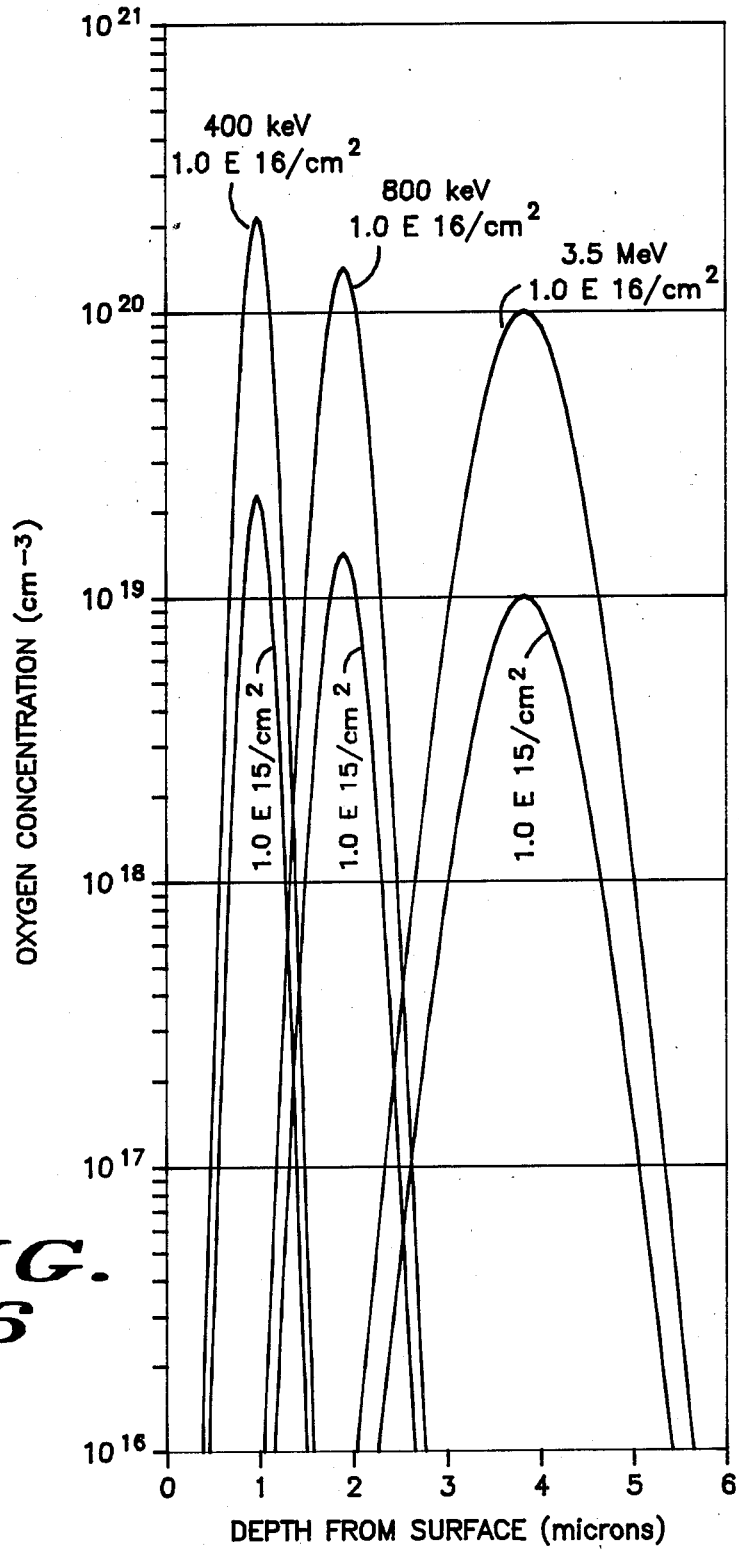
FIG. 6 shows calculated values for the expected oxygen concentration in silicon as a function of depth from the surface of the substrate for various implant energies and doses.

Oxygen has been found to be a suitable material for forming free carrier shield region 71*c* in silicon. The depth of shield region 71*c* below surface 71*u* can be varied by varying the implant energy (see FIG. 6). For example, when oxygen is implanted in silicon with an energy of about 400 keV, the center of the implanted oxygen distribution is located about one micron below surface 71*u*. At 800 keV the center of the implant distribution is approximately two microns below surface 71*u*, and at 3,500 keV the center is about four microns below surface 71*u*. The width of the implanted distribution at a particular concentration level depends upon the energy and total dose. Profiles of concentration versus depth from the surface for various implantation energies and doses are shown in FIG. 6. The profiles of FIG. 6 are calculated based upon the known characteristics of silicon and oxygen. These calculated profiles correlate well with the corresponding values for the location of the distribution peak and the width of the distribution, deduced from electrical lifetime measurements as a function of depth, and are believed to reasonably represent the implanted impurity profiles.

Figure 5D:
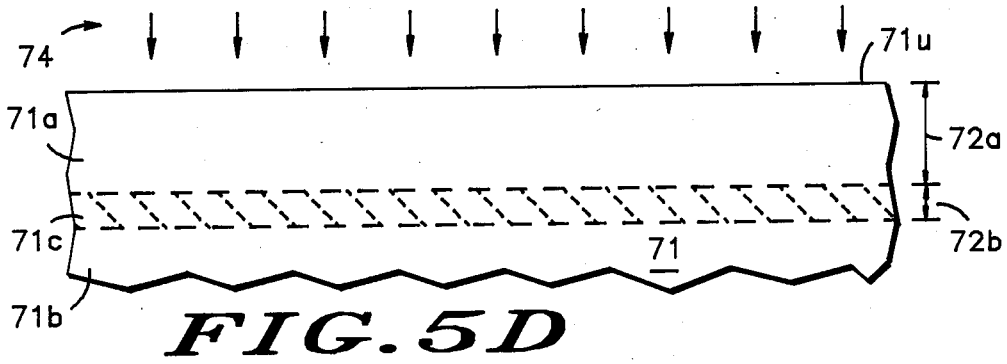
Figure 5E:
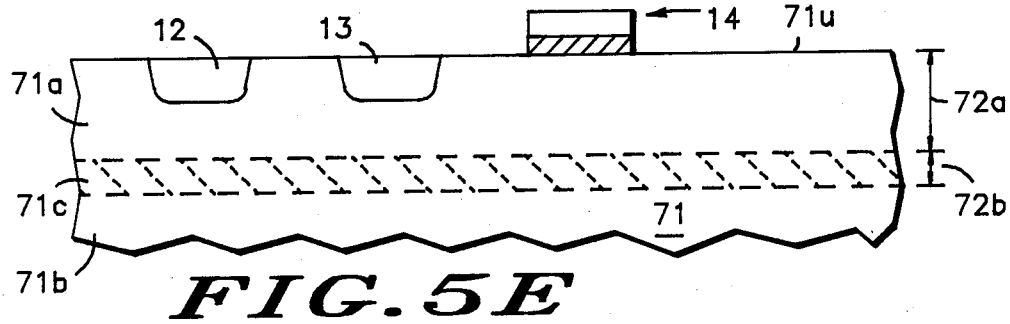

FIGS. 5D–E illustrate an alternative sequence for the construction of the means of the present invention. Starting with bare substrate 71 as illustrated in FIG. 5A, lifetime killing impurity ions 74 are implanted in substrate 71 (FIG. 5D) to form low lifetime shield region 71*c* of width 72*b* lying beneath high lifetime region 71*a* of thickness 72*a* in substrate 71. Subsequent to implantation of low lifetime shield region 71*c*, charge storage device regions 12 and 14 are formed in surface 71*u* of substrate 71 (FIG. 5E) using conventional techniques. This is a preferred procedure.

Figure 5F:
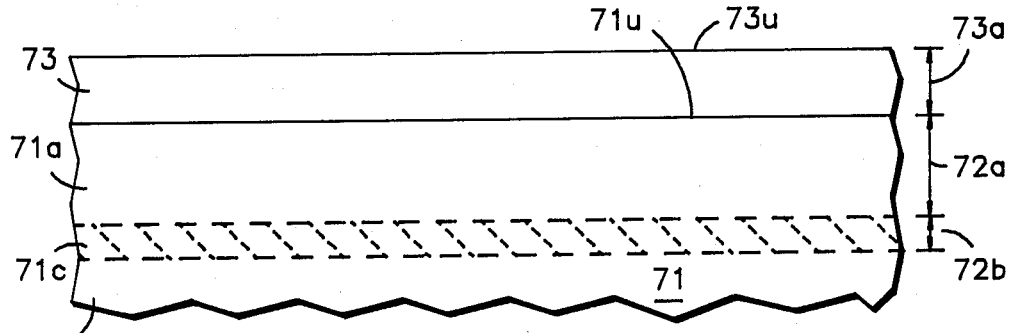
Figure 5G:
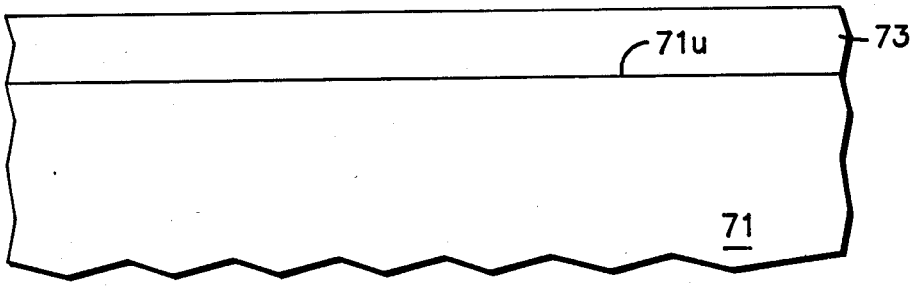
Figure 5H:
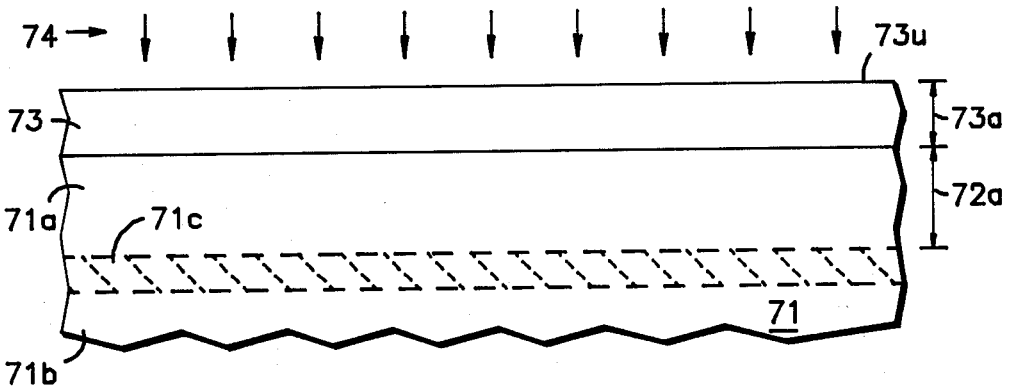
Figure 5I:
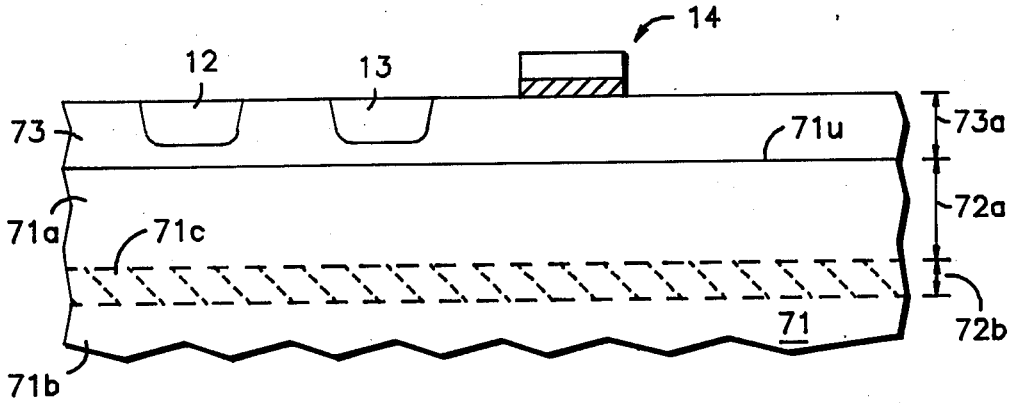

In some cases, it is desirable to fabricate charge storage devices 12 and 14 in an epitaxial layer. The finished structure is illustrated in FIG. 5I wherein substrate 71 has thereon epitaxial layer 73 of thickness 73*a* in which are fabricated charge storage device regions 12 and 14 Low lifetime carrier shield region 71*c* of width 72*b* is located in substrate 71 below undisturbed region 71*a* of width thickness 72*a*. Means for obtaining the structure of FIG. 5I are illustrated in FIGS. 5F–H. In a first embodiment of the process making use of epitaxial layers, bare substrate 71 (FIG. 5A) is implanted with ions 74 to produce low lifetime buried shield layer 71*c*, as is illustrated in FIG. 5D. Epitaxial layer 73 is then applied to surface 71*u* of substrate 71, as illustrated in FIG. 5F.

In an alternative embodiment of the process, bare substrate 71 (FIG. 5A) is coated with epitaxial layer 73 prior to formation of buried low lifetime shield layer 71*c* (FIG. 5G). The epitaxially coated substrate is then implanted with ions 74 to produce buried low lifetime shield layer 71*c*, as illustrated in FIG. 5H.

Once the combination of substrate 71 containing buried low lifetime shield layer 71*c* and surmounted by epitaxial layer 73 is obtained either following the sequence of FIGS. 5A, 5D, 5F or FIGS. 5A, 5G, 5H, then device regions 12, 13, or 14 are fabricated in epitaxial layer 73 by conventional methods well-known in the art. Those of skill in the art will appreciate that different implant energies must be used according to whether the implant step is performed before application of epitaxial layer 73, (e.g., FIG. 5D) or after application of epitaxial layer 73 (e.g., FIG. 5H). The differences in implant energy are necessary to take into account the differences in the thickness of material which ions 74 must penetrate so as to be deposited in region 71*c* at depth 72*a* below surface 71*u* of substrate 71 or depth 72*a* + 73*a* below surface 73*u* of layer 73, depending upon whether the implantation is performed before or after formation of layer 73.

EXPERIMENTAL RESULTS

It has been found that low lifetime shield region 71*c* may be implanted within substrate 71 with the center of the implant region located approximately from about 0.5 to 5 or more microns below surface 71*u*. Tests show that this can be accomplished without substantial degradation of the properties of overlying region 71*a*. This is important, since if region 71*a* is adversely affected by the implantation of region 71*c*, charge storage devices 12 and 14 fabricated in layer 71*a* will be adversely affected and their properties degraded. Similarly, if region 71*a* is adversely affected by the implantation of region 71*c*, overgrown epi-layer 73 will also be degraded.

Polished dislocation free silicon wafers were utilized for the measurements. Oxygen implantation at 400 keV was carried out in an Extrion Type 400-10 implanter using $O^+$ ions derived from an $O_2$ source. The total beam current was about 100 micro-amps of $O^+$ of which about 60% stuck the wafer. The Extrion implanter is manufactured by the Extrion Division of Varian, Inc., Glouster, Mass. Implants at 3,500 keV were carried out in a General Ionex Tandetron implanter using a Duoplasmatron Source supplied with $O_2$ gas. Beam currents were about 2 micro-amps of $O^{++}$, substantially all of which struck the wafer. Implantation on the General Ionex implanter was obtained through Universal Energy Systems of Dayton, Ohio. Typical implant doses and energies are shown in Table I. The implants were generally made into bare silicon wafers. However, samples SW5-A and B were covered with a 0.02 micron oxide layer prior to implantation. This oxide layer is too thin to have any appreciable affect on the ion penetration depth. No attempt was made to control the wafer temperature during implantation. After implantation the wafers were heated as shown in Table I in order to react the oxygen with the silicon substrate material to activate the recombination centers and form stable $SiO_x$ complexes. Generally, the oxygen implants were carried out before the test diodes and MOS capacitors were formed. Where epitaxial layers were utilized, the oxygen implants were generally made prior to forming the epitaxial layer. The epitaxial layers, diodes, and MOS capacitors were formed using conventional techniques well known in the art.

Diodes and MOS capacitors analogous to device regions 12–14 of FIG. 3 were formed according to the general procedure outlines in connection with FIGS. 5A–I, using conventional device fabrication techniques. For example, oxygen implanted P-type silicon wafers were oxidized at about 1000° C. in oxygen to form a surface oxide layer for masking purposes. A photoresist layer was applied to define openings in the surface oxide layer through which N+P diodes were formed by conventional diffusion at about 950° C. using a phosphorous dopant. Following junction formation, the wafers were reoxidized at 900° C. and 1050° C. to form a gate oxide for the MOS capacitors. A metal layer was evaporated and patterned using conventional techniques to form the electrode of the MOS capacitors and the contacts to the N-P diodes.

Figure 7A:
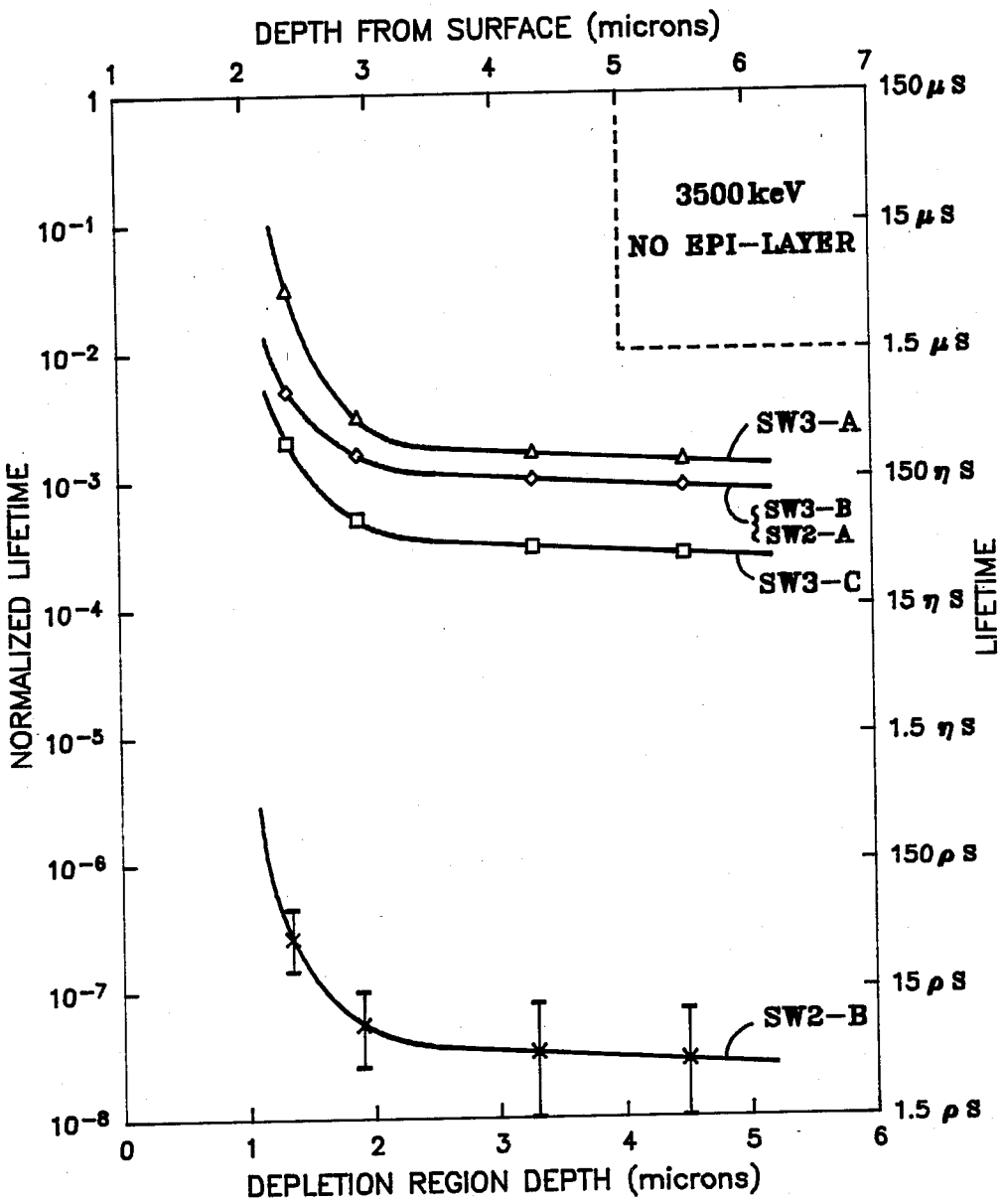
FIGS. 7A-B show plots of the normalized effective lifetime as a function of depth from the surface of the substrate for different implant doses of oxygen.
Figure 7B:
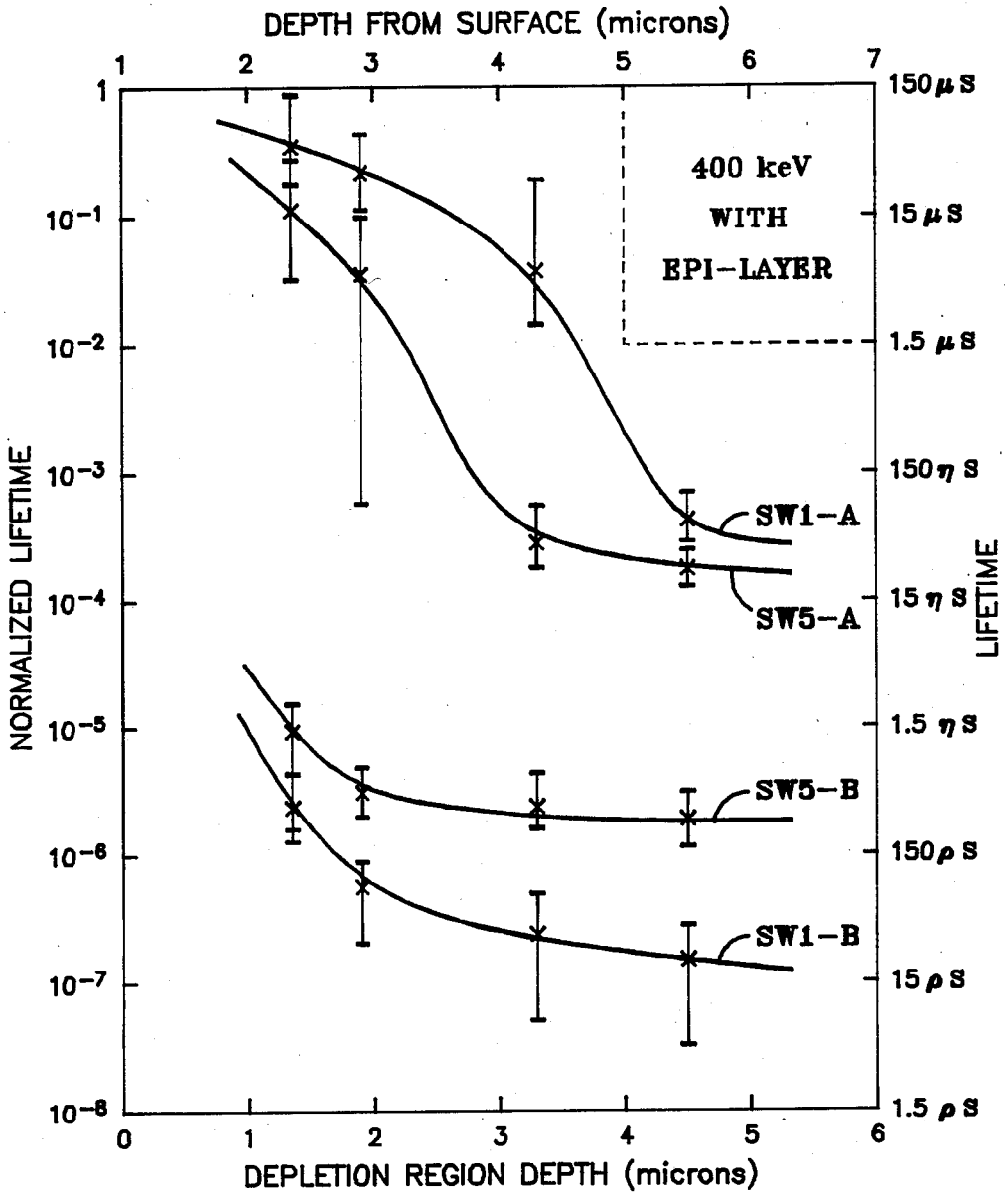
Figure 8:
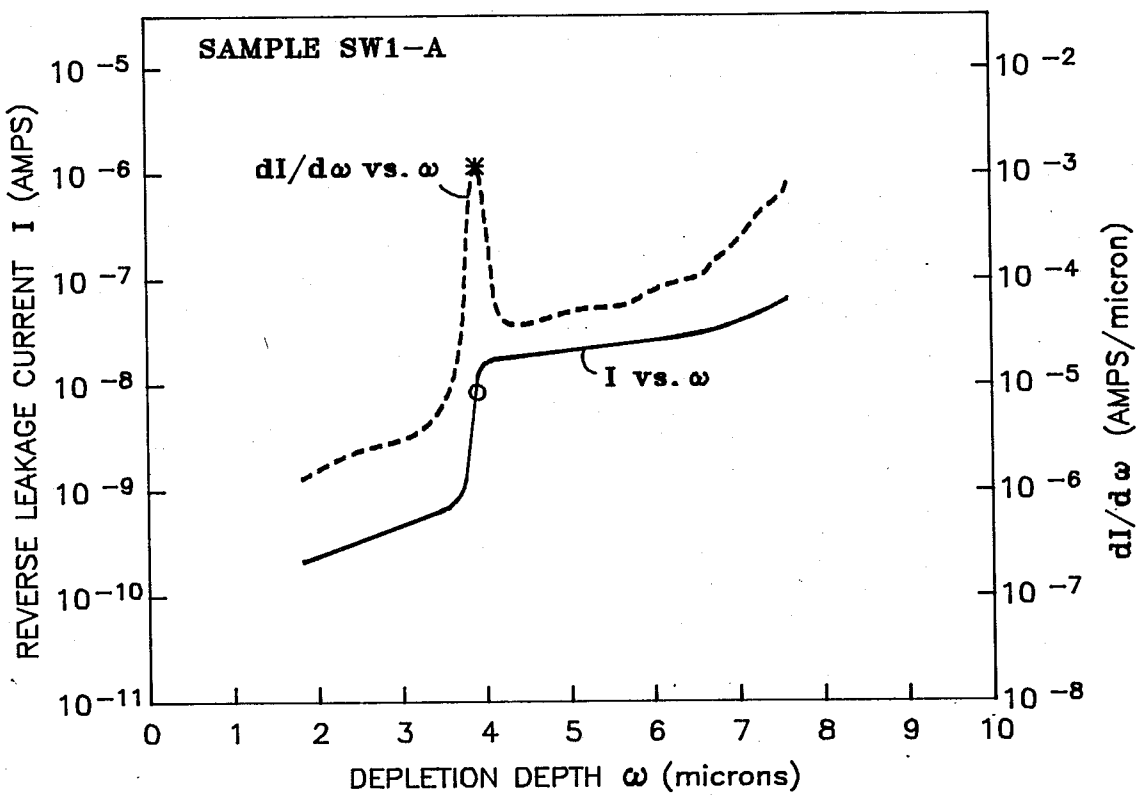
FIG. 8 shows plots of leakage current (I) versus depletion depth (w), and rate of charge of leakage current with depletion depth (dl/dw) versus depletion depth (w), for an N+P diode in an epitaxially coated oxygen implanted silicon substrate.

Average bulk lifetime values for individual wafers were calculated from reverse recovery-time measurements on the diodes, using techniques well known in the art. Generation lifetime values were calculated from capacitance relaxation-time measurements on MOS capacitors adjacent to the diodes using the well-known Zerbst method. In addition to lifetime measurements, the leakage current of the diodes was measured as a function of voltage. The resistivity of the starting wafer and epitaxial layers and the oxygen implant depths were chosen such that the depletion layers of the MOS capacitors and the N+P diodes could be swept through the implanted low lifetime zone. In this way the presence or absence of the low lifetime zone could be detected from the capacitor and diode characteristics and the magnitude of the lifetime in the zone calculated. The lifetime at the semiconductor surface at locations protected from the oxygen implant was also measured as a reference. The results of these measurements are shown in FIGS. 7A–B and 8, for the following samples identified in Table I.

TABLE I

OXYGEN IMPLANT ENERGIES, DOSES, CONCENTRATIONS, DEPTHS, AND HEAT TREATMENTS

| SAMPLE NO. | ENERGY (keV) | DOSE ($cm^{-2}$) | PEAK CONC. ($cm^{-3}$) | EPI THICK (microns) | PEAK DEPTH (microns) | POST IMPLANT HEATING CYCLES t (min) @ T °C. |
|---|---|---|---|---|---|---|
| SW1-A | 400 | $3 \times 10^{15}$ | $7 \times 10^{19}$ | 4 | 5 | [30 @ 900] |
| SW1-B | 400 | $1 \times 10^{16}$ | $2 \times 10^{20}$ | 4 | 5 | [30 @ 900] |
| SW2-A | 3,500 | $3 \times 10^{15}$ | $3 \times 10^{19}$ | 0 | 4 | [30 @ 900] |
| SW2-B | 3,500 | $1 \times 10^{16}$ | $1 \times 10^{20}$ | 0 | 4 | [30 @ 900] |
| SW3-A | 3,500 | $1 \times 10^{15}$ | $1 \times 10^{19}$ | 0 | 4 | [60 @ 800 + |
| SW3-B | 3,500 | $3 \times 10^{15}$ | $3 \times 10^{19}$ | 0 | 4 | 30 @ 1050; or |
| SW3-C | 3,500 | $6 \times 10^{15}$ | $6 \times 10^{20}$ | 0 | 4 | 60 @ 1050] |
| SW5-A | 400 | $3 \times 10^{15}$ | $7 \times 10^{19}$ | 4 | 5 | [30 @ 900 + |
| SW5-B | 400 | $1 \times 10^{16}$ | $2 \times 10^{20}$ | 4 | 5 | 30 @ 1050] |

The entries in the column labeled "EPI THICK" are the thickness of any epi-layer overlying the implanted wafer. The "PEAK DEPTH" shown in Table I is the estimated depth below the surface, of the peak of the implant concentration profile, including any overlying epi-layer. Where an epi-layer was used the test devices were built in the epi-layer. For the samples of Table I, the implant depth and the epi-layer thickness were varied in tandem so that the implant profiles were located about 4 to 5 microns below the surface in which the test devices were fabricated. This procedure allowed reasonably direct comparison of non-epi and epi-layer results. The implant penetration depths and the concentration profiles were calculated using methods well known in the art for estimating the stopping distances of implanted ions and the resulting profiles. The results of these calculations are shown in detail in FIG. 6. It should be noted that the peak oxygen concentrations obtained by the method of the present invention and shown in Table I are substantially above the solid solubility limit of oxygen in silicon, which is about $1-2\times10^{18}$ per $cm^3$.

In addition to the thermal cycles indicated in Table I, the wafers of Table I were subjected to further post-implant heating during the formation of the test diodes and MOS capacitors. These further heating cycles were: 90–165 min. at 1000° C. for initial oxidation; 25 min. at 950° C. during phosphorous diffusion; 75–115 min. at 900° C. during reoxidation; and 135 min. at 1050° C. for gate oxidation. The wafers coated with epitaxial layers were subjected to an additional heating cycle of 4 min. at 1160° C. during epi-layer growth prior to fabrication of the test devices.

FIGS. 7A–B show the effective lifetime calculated from the I–V characteristics of the N+P diodes, normalized to the lifetime at the surface, plotted as a function of depth into the structure, for the samples of Table I. The effective generation lifetimes calculated from the I–V characteristics were checked against values determined from relaxation time measurements on adjacent MOS capacitors. Agreement was generally good.

The peak of the oxygen implant distribution is estimated as lying four to five microns beneath the surface of the structures. The effective lifetime at the surface was determined separately to be approximately 150 microseconds. The various curves in FIGS. 7A–B are labelled to indicate their correspondence to the values in Table I. All of the curves of FIGS. 7A–B trend toward the surface lifetime value of 150 microseconds at zero bias depletion depth. Note that the depletion region depth is given on the scale at the bottom of the FIGS. 7A–B and the depth from the surface is give on the upper scale of the FIGS. 7A–B. Both depths are measured in microns.

The results presented in FIGS. 7A–B show that at a dose of about $3\times10^{15}$ ions per square centimeter, the effective lifetime drops-off from a surface value of approximately 150 microseconds to a value of less than 150 nanoseconds. This is a lifetime reduction ratio in the range of $10^{-3}$ to $10^{-4}$. In general, the higher the dose, the more the lifetime is reduced in the implanted zone. For a dose of about $1\times10^{16}$ ions per square centimeter, the effective lifetime drops-off from the surface value of about 150 microseconds to a range about 5 to 200 picoseconds. This is an apparent reduction ratio of as much as $10^{-7}$. Thus, the method of the present invention provides an extremely low lifetime region buried beneath an undisturbed surface layer.

The data presented in FIG. 7A corresponds to samples without epi-layers implanted using 3,500 keV oxygen ions. As shown in FIG. 6, the peak of the implant distribution is expected to lie about 4 microns below the surface, and the half-width at a concentration of about $10^{18}$ per cm is estimated to be about 1 micron for a dose of $1\times10^{15}$ per cm , and about 1.5 microns for a dose of $1\times10^{16}$ per $cm^2$. Thus, significant reduction in the lifetime should be observed at about 3 microns depth from the surface for doses above about $1\times10^{15}$ per $cm^2$ and at about 2.5 microns for doses approaching $1\times10^{16}$ per $cm^2$. The drop off in lifetime plotted in FIG. 7A corresponds reasonably well with these predictions, with the curves for higher doses showing a more rapid drop at smaller depths, as would be expected.

The data of FIG. 7B corresponds to samples implanted at 400 keV and overcoated with an epi-layer about four microns thick. The calculations of FIG. 6 show that the widths of the oxygen implants made at 400 keV are substantially smaller than those made at 3,500 keV. Thus, the drop-off in lifetime in FIG. 7B should take place at a greater depth from the surface and be more gradual, as compared to FIG. 7A. This is what is observed. This indicates that the depth of the implanted distribution below the surface can be controlled by varying the implant energy or the epi-layer thickness or both.

It should also be noted that the very low values of lifetime for the implanted region and the very large lifetime reduction ratios observed in these samples are measured after the wafers have been extensively heated, both to activate the implanted oxygen, as will be discussed in more detail later, and also in connection with the fabrication of the epitaxial layers and the test devices after the implants were performed. Thus, unlike prior art approaches, the means and method of the present invention, of implanting a super-saturated layer of reactive ions, is not subject to any significant tendency for the lifetime reduction centers to anneal out during post implant heating. This indicates that the very low lifetimes obtained by the present invention are extremely stable. This is a highly desirable property.

The implanted oxygen zone may be observed directly by measuring the leakage current of the $N^+P$ diodes at different values of bias. These results are provided in FIG. 8 for sample Number SW1-A which was implanted at 400 keV to a dose of $3\times10^{15}$ ions per $cm^2$ and then covered with a four micron epi-layer. The $N^+P$ diodes were fabricated in the epi-layer and had an area of $6\times10^{-3}$ $cm^2$. The solid curve in FIG. 8 is a plot of leakage current (I) versus depletion depth (w). The depletion region width is varied by varying the bias voltage. A log-linear scale is used in FIG. 8. Near zero volts bias, the depletion region is so thin that it does not extend into the implanted oxygen zone underlying the diode. Since the surface material has very high lifetime and therefore very low thermal generation rates, the leakage current is very low under these conditions, e.g., about $10^{-10}$ amps. The fact that the leakage current is so low is further evidence that the surface layers above the implanted region have not been damaged by the implant process, or at least that any damage which may have been created did not propagate into the epi-layer in which the test devices were formed. As the bias on the diode is increased, the depletion region expands and the leakage current increases. So long as the depletion region does not touch the low lifetime (high thermal generation rate) implanted zone, the leakage current increases relatively slowly. But, when the bias voltage is increased to the point where the expanding depletion region passes through the low lifetime (high thermal generation rate) implanted zone, then the leakage current increases dramatically. This occurs because the same deep recombination centers that provide low lifetime also provide high thermal generation currents. It can be seen in FIG. 8 that a large change in leakage current occurs over a very small change in depletion depth, indicating that the low lifetime implant zone is very thin, as expected from the calculated implant profiles. Once the depletion region encompasses the whole implanted zone, the leakage current levels off again, since further expansion of the depletion region does not sweep-in significantly more recombination-generation centers. At still larger depletion widths the gradual increase in leakage current resumes as would be expected for a normal diode.

The dashed curve in FIG. 8 shows the slope (dI/dw) of the I-w plot as a function of depletion depth. A large peak is observed corresponding to the point where the depletion region passes through the buried low lifetime implant region. This peak, indicated by the star on the dashed curve, was calculated to be 4 microns below the junction and about 5 microns below the surface.

The curves of FIG. 8 provide direct observational evidence that the low lifetime shield region or zone, formed according to the teaching of the present invention, does not perturb or damage the surface of the implanted substrate or epi-layer, that it is very narrow, and that it provides a very large density of deep recombination-generation centers.

A feature of the present invention is that the low lifetime shield region may be localized both in area and depth. Area localization is accomplished by masking the surface of the wafer during implantation, for example, by using a heavy layer of resist or other implant resistant material. In this way, the lifetime killer ions forming the free carrier shield zone can be implanted in one area of the wafer and not in another. Further, as is apparent from FIGS. 6 and 7A–B, the depth of the implanted zone can be varied by adjusting the implant energy and/or the epi-layer thickness. The minimum depth is set by the requirement that the device depletion layer not penetrate into the shield region. The maximum depth can be varied over a range of many microns by using higher energy implants and/or thicker epi-layers. However, maximum shielding effect is obtained when the shield zone is kept as close as possible to the depletion layer without touching. When large depths are needed, as for example to accommodate deep depletion layers, it is desirable to use an epilayer structure since, as can be seen in FIG. 6, the width of the implanted zone at a given concentration increases and the peak concentration decreases for the same dose, as the energy is increased to obtain greater ion penetration depth. Thus, charge storage device structures which employ a shallow low lifetime shield region in a substrate, which is then coated by an overlying epi-layer, are expected to give better performance, and are preferred.

It has been found that the lifetime killing action of the implanted impurities is stable if the substrate is heated during or after implantation to react the implanted impurities with the substrate material and form chemically bonded complexes which provide a rich abundance of deep recombination centers. This process is generally referred to herein as activation. Implanted oxygen in silicon is believed to form $SiO_x$ complexes. These complexes have been observed using transmission electron microscopy and appear to be very finely divided, e.g., about 100 Angstroms ($10^{-8}$m) in size. The complexes are surrounded by larger dislocations. In order that the activated recombination centers be stable and not redissolve in the substrate or otherwise anneal away, the concentration of the implanted impurities must be above the solid solubility limit of the ion in the semiconductor material. The activation heating may be performed in any type of heating means. For the samples of Table I, activation heating was carried out in an ordinary tube furnace of the type commonly used for diffusion or oxidation of semiconductors such as silicon, generally in a nitrogen atmosphere. The times and temperatures are indicated in Table I.

However, it is preferable to perform the activation process using rapid isothermal heating techniques. A model I A-2000 Rapid Isothermal Annealing (RIA) apparatus manufactured by Varian-Extrion of Glouster, Mass. is suitable. The implanted wafer or substrate is placed in a vacuum chamber in the RIA apparatus where it is thermally isolated and separated by a shutter from a hot heater block held at a high temperature, for example, 900–1300 ° C. To start the annealing cycle, the shutter is rapidly moved aside so that the wafer is suddenly exposed to the high temperature radiation from the heater. Since the thermal mass of the wafer is small its temperature rises very rapidly. An optical pyrometer located behind the wafer is used to measure its temperature. Once the wafer has reached the desired annealing temperature, the shutter is closed and, again because of the low thermal mass of the wafer and the rapid radiant energy loss from the wafer, the wafer temperature falls very rapidly toward room temperature. Thus, the RIA apparatus permits a wafer to be heated from room temperature to 900°–1300° C. and cooled back to the vicinity of room temperature in a matter of a few seconds or tens of seconds. For example, heating to over 1100° C. in 5–30 seconds and dropping back below about 800° C. in another 5–30 seconds can be achieved. This treatment is particularly desirable for activation of implanted lifetime killing impurity ions, since it provides activation without allowing time for substantial thermal diffusion which can cause the implanted impurity distribution to spread out.

As reported in copending application Ser. No. 588, 628 by J. L. Chruma et al., when RIA is used to anneal very high concentration implants of ordinary dopants such as As, there is no appreciable lateral spreading of the implanted distribution as a result of RIA annealing or activation, and the impurity distribution appears steeper after RIA than before. It is believed that this same effect will be observed with the type of impurities used herein for lifetime control. Thus, it is highly desirable to use RIA for purposes of providing a lifetime killing shield layer using implanted impurities, since the impurities can be activated without significant later spreading. A very high concentration of lifetime killing impurities can be obtained which has very steep skirts on a log-linear concentration profile. This permits the carrier shield region to be placed closer to the depletion region penetration zone for maximum shielding effect.

While oxygen has been found to be a suitable impurity ion for formation of the carrier shield region, other impurities can also be used. However, the choice of impurities is constrained by particular requirements. Some impurities are not suitable. For example, to be effective as lifetime killers, an impurity must provide deep recombination centers, i.e. recombination levels located in the vicinity of the middle of the forbidden energy gap of the semiconductor material being used. The action of deep centers or levels in promoting carrier recombination is described by A. S. Grove, "Physics and Technology of Semiconductor Devices," John Wiley and Sons, New York, 1967, Section 5.2, "Kinetics of the Recombination Process."

Also, impurities which provide a high density of shallow donor or acceptor levels are less desirable, since the shallow donor or acceptor levels will generally be ionized at ordinary temperatures. Thus, such impurities will produce a substantial change in the conductivity and type, which is generally undesirable. When implanted in silicon, many elements from column 3*a* and column 5*a* of the periodic table of elements are generally known to provide a high density of shallow levels. Examples of such elements are B, Al, and Ga from column 3*a*, and P, As, and Sb from column 5*a*. Such elements are undesirable. As used herein, the words "periodic table" refer to the Periodic Table of the Elements published in the Handbook of Chemistry and Physics, 61st Edition, 1980–81, CRC Press, Boca Raton, Fla., inside front cover.

Some effect on conductivity by lifetime killing impurities is usually observed since many lifetime killing impurities also provide some shallow donor or acceptor levels. Oxygen for example is a weak N-type impurity but is still suitable. Nitrogen is also expected to be a useful element as a lifetime killer even though located in column 5*a*, since it is not believed to be a strong dopant atom in silicon but is expected to provide deep recombination levels.

Further, impurities which diffuse very rapidly and at relatively low temperatures are not useful, since during subsequent heating steps they can spread into the surface portions occupied by the depletion regions of the charge storage devices. This will increase the leakage currents in the charge storage devices and degrade their charge storage properties. Gold is an example of a material which provides deep recombination centers, but has too high a diffusivity. For silicon based devices, lifetime killer impurities which have values of diffusivity D corresponding to $(D)^{\frac{1}{2}} > 50$ microns per square root hour, in the temperature range of interest for device fabrication, that is, 900°–1300° C., are not expected to be useful.

Finally, impurities or particles which provide deep recombination centers mostly by virtue of the lattice damage they create during implantation or by formation of unreacted precipitates (e.g., gas bubbles), are less desirable because of the tendency of the lifetime killing effect to anneal away during subsequent heating. Noble gases are examples of this type of impurity. Argon in particular is known to provide thermally annealable recombination centers. Such materials generally do not form stable chemically bound complexes with the substrate material.

In summary, impurity ions suitable for use in forming a free carrier shield region according to the present invention must be chosen from among the elements which provide deep recombination centers or levels, which react chemically with the substrate material so as to form bound complexes which do not substantially reabsorb or anneal out during subsequent heating, and which do not have a diffusivity so high as to preclude maintaining the implanted ions in a predetermined zone within the semiconductor substrate under the temperatures required in subsequent device manufacturing and use. Further it is desirable to chose elements from among those which do not provide a high density of shallow donor or acceptor levels. For silicon, materials having a diffusivity satisfying the relation $(D)^{\frac{1}{2}} > 50$ microns per square root hour in the range 900° to 1300° C. are not expected to be suitable, and common donors and acceptors from columns 3*a* and 5*a* of the periodic table are undesirable.

It has been found that carbon in silicon affects the propensity of oxygen to precipitate from solution and form deep recombination levels. The exact mechanism by which this occurs is not clearly understood. Nevertheless, carbon provides a useful means of controlling the nucleation and reaction of lifetime killing impurities such as oxygen. In a further embodiment of the present invention, carbon is implanted in the semiconductor substrate to stimulate the localized nucleation and reaction of dissolved or implanted oxygen or other reactive lifetime killing impurity. When carbon is present, the oxygen preferentially reacts on or near the carbon, rather than nucleating and reacting at random. Hence, the carbon allows greater control of the distribution of the lifetime killing complexes within the substrate. Alternatively, carbon may be first implanted and then oxygen or another lifetime killing impurity implanted subsequently, using the carbon implanted region for purposes of promoting the nucleation and activation of the later implanted oxygen or other lifetime killer. Carbon may also function as a recombination center itself.

Having thus described the invention, it will be apparent that the invention provides an improved means and method for shielding charge storage devices in semicon-ductor substrates from the deleterious effects of incident radiation or particles, or from carriers which may be injected from nearby junctions or by charge pumping. It is further apparent that the invented means and method provides a very low lifetime free carrier shield zone or region immediately beneath a high lifetime surface layer suitable for construction of charge storage devices. Additionally, the concentration of lifetime killing impurities which can be provided in the carrier shield zone is very large, being at least an order of magnitude greater than the normal solid solubility. As a consequence, the lifetime reduction ratios obtained by the present invention in the carrier shield region are also very large, e.g. as much as $10^{-7}$ or more. Further, since the chosen impurity ions react chemically with the substrate material to form bound complex exhibiting deep lying recombination levels, the lifetime killing properties of the shield layer are stable with time and temperature. Additionally, the present means and method permits the carrier shield region to be localized both laterally, so as to encompass only those device regions where it is desired, and in depth so as to permit optimum adjustment of the shielding effect. Further, the low lifetime carrier shield region can be buried in the device substrate without deleterious effect upon the lifetime in the overlying surface regions or epitaxial layers which may be grown on the surface of the implanted substrate.

While the present invention has been described in terms of particular combinations of semiconductor materials and lifetime killing impurities, it will be apparent to those of skill in the art that the teachings of the present invention apply to other semiconductor materials, and/or to other lifetime killing impurities selected in accordance with the teachings of the present invention. Accordingly, it is intended to incorporate all such variations in the claims which follow.

We claim:

1. A semiconductor device comprising:

a single crystal silicon substrate having first and second major surfaces separated by a first distance;

a first semiconducting region located in said substrate adjacent said first surface and having a first thickness and a first lifetime for charge storage devices; and a second region in said substrate underlying said first region and having a second lifetime lower than said first lifetime, wherein said second region has been implanted with oxygen to provide in said second region an oxygen concentration higher than adjacent regions and having a peak value exceeding a solid solubility limit of oxygen in silicon but less than a value for forming an insulating layer of silicon oxide, and wherein said second oxygen containing region has a second thickness that is small compared to said first distance.

2. The device of claim 1 wherein said second thickness is about four microns or less.

3. A semiconductor device comprising:

a single crystal silicon substrate having first and second surfaces separated by a first distance and first and second superposed semiconductor regions underlying said first surface and separated from said second surface by a second distance;

wherein said first region, adjacent said first surface, has a first lifetime for constructing charge storage devices;

wherein said second region, underlying said first region and separated from said second surface by said second distance, has a peak concentration of oxygen exceeding a solid solubility of oxygen in silicon at the melting point of silicon but less than a concentration for an insulating silicon oxide layer; and wherein said second region has a thickness small compared to said second distance.

4. The device of claim 3 wherein said substrate has a first lateral extent and wherein said second region has a second lateral extent less than said first lateral extent.

5. A semiconductor device comprising:

a single crystal semiconductor substrate having first and second major surfaces separated by a first distance;

wherein said substrate contains a first region adjacent said first surface and of a first thickness small compared to said first distance and having a lifetime for charge storage devices;

wherein said substrate contains a second oxygen and carbon containing region of low lifetime relative to said first region underlying said first region and of a second thickness;

wherein said oxygen concentration in said second region exceeds a solid solubility limit for oxygen in said substrate but less than an amount for forming an insulating oxide layer in said second region;

wherein said substrate contains a third region of a third thickness between said second region and said second surface, and having lower oxygen concentrations than said second region; and wherein said second thickness is small compared to said third thickness.

* * * * *